(12) United States Patent
Armstrong et al.

(10) Patent No.: US 7,672,043 B2
(45) Date of Patent: Mar. 2, 2010

(54) CATADIOPTRIC IMAGING SYSTEM EXHIBITING ENHANCED DEEP ULTRAVIOLET SPECTRAL BANDWIDTH

(75) Inventors: J. Joseph Armstrong, Milpitas, CA (US); Yung-Ho Chuang, Cupertino, CA (US); David R. Shafer, Fairfield, CT (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 384 days.

(21) Appl. No.: 10/903,494

(22) Filed: Jul. 29, 2004

(65) Prior Publication Data

US 2005/0259318 A1 Nov. 24, 2005

Related U.S. Application Data

(63) Continuation-in-part of application No. 10/434,374, filed on May 7, 2003.

(60) Provisional application No. 60/449,326, filed on Feb. 21, 2003.

(51) Int. Cl.
*G02B 5/08* (2006.01)
(52) U.S. Cl. ................... 359/351; 359/350
(58) Field of Classification Search ........... 359/350, 359/351
See application file for complete search history.

(56) References Cited

U.S. PATENT DOCUMENTS

| | | | |
|---|---|---|---|
| 1,973,066 A | 9/1934 | Hauser et al. | |
| 2,661,658 A | 12/1953 | Dyson | |
| 3,237,515 A | 3/1966 | Altman | |
| 4,155,630 A | 5/1979 | Ih | |
| 4,511,220 A | 4/1985 | Scully | |
| 4,647,158 A | 3/1987 | Yeadon | |
| 4,758,088 A | 7/1988 | Doyle | |

(Continued)

FOREIGN PATENT DOCUMENTS

DE 108181 1/1900

(Continued)

OTHER PUBLICATIONS

M.R. Bartz et al., "LED Print Analyzer," IBM Technical Disclosure Bulletin, vol. 14, No. 3, Aug. 1971.

(Continued)

*Primary Examiner*—Joshua L Pritchett
(74) *Attorney, Agent, or Firm*—Smyrski Law Group, A P.C.

(57) ABSTRACT

A relatively high spectral bandwidth objective employed for use in imaging a specimen and method for imaging a specimen is provided. The objective includes a lens group having at least one focusing lens configured to receive light energy and form an intermediate image, at least one field lens oriented to receive the intermediate image and provide intermediate light energy, and a Mangin mirror arrangement positioned to receive the intermediate light energy and apply light energy to the specimen. The objective may provide, in certain instances, a spectral bandwidth up to approximately 193 to 266 nanometers and can provide numerical apertures in excess of 0.9. Elements are less than 100 millimeters in diameter and may fit within a standard microscope. The field lens may include more than one lens and may be formed of a material different from at least one other lens in the objective.

22 Claims, 5 Drawing Sheets

U.S. PATENT DOCUMENTS

| | | | |
|---|---|---|---|
| 4,779,966 A | 10/1988 | Friedman | |
| 4,795,244 A | 1/1989 | Uehara | |
| 4,898,471 A | 2/1990 | Vaught et al. | |
| 4,971,428 A | 11/1990 | Moskovich | |
| 4,974,094 A | 11/1990 | Morito | |
| 5,031,976 A * | 7/1991 | Shafer | 359/355 |
| 5,089,913 A | 2/1992 | Singh et al. | |
| 5,114,238 A | 5/1992 | Sigler | |
| 5,140,459 A | 8/1992 | Sagan | |
| 5,162,939 A | 11/1992 | Herron et al. | |
| 5,177,559 A | 1/1993 | Batchelder et al. | |
| 5,233,460 A | 8/1993 | Partlo | |
| 5,264,912 A | 11/1993 | Vaught et al. | |
| 5,274,494 A | 12/1993 | Rafanelli et al. | |
| 5,309,456 A | 5/1994 | Horton | |
| 5,323,263 A | 6/1994 | Schoenmakers | |
| 5,337,170 A | 8/1994 | Khoury et al. | |
| 5,428,442 A | 6/1995 | Lin et al. | |
| 5,434,662 A | 7/1995 | Rockwell et al. | |
| 5,488,229 A | 1/1996 | Elliott et al. | |
| 5,515,207 A | 5/1996 | Foo | |
| 5,621,529 A | 4/1997 | Gordon et al. | |
| 5,636,066 A | 6/1997 | Takahashi | |
| 5,644,140 A | 7/1997 | Biedermann et al. | |
| 5,668,673 A | 9/1997 | Suenaga et al. | |
| 5,717,518 A | 2/1998 | Shafer et al. | |
| 5,729,374 A | 3/1998 | Tiszauer et al. | |
| 5,805,334 A | 9/1998 | Takahashi | |
| 5,805,357 A | 9/1998 | Omura | |
| 5,808,797 A | 9/1998 | Bloom et al. | |
| 5,808,805 A | 9/1998 | Takahashi | |
| 5,835,275 A | 11/1998 | Takahashi et al. | |
| 5,849,468 A | 12/1998 | Sawyer | |
| 5,851,740 A | 12/1998 | Sawyer | |
| 5,861,997 A | 1/1999 | Takahashi | |
| 5,880,891 A | 3/1999 | Furter | |
| 5,990,983 A | 11/1999 | Hargis et al. | |
| 5,999,310 A | 12/1999 | Shafer et al. | |
| 6,064,517 A | 5/2000 | Chuang et al. | |
| 6,191,887 B1 | 2/2001 | Michaloski et al. | |
| 6,275,514 B1 | 8/2001 | Katzir et al. | |
| 6,362,923 B1 * | 3/2002 | Lange et al. | 359/689 |
| 6,370,178 B1 | 4/2002 | Papayoanou et al. | |
| 6,548,797 B1 | 4/2003 | Ai | |
| 2001/0040722 A1 * | 11/2001 | Shafer et al. | 359/351 |
| 2003/0076583 A1 * | 4/2003 | Shafer et al. | 359/357 |

FOREIGN PATENT DOCUMENTS

| | | |
|---|---|---|
| DE | 3742806 A | 7/1989 |
| EP | 0798585 A2 | 10/1997 |
| GB | 2269024 A | 1/1994 |
| WO | WO 97/12226 | 4/1997 |
| WO | WO 99/08134 | 2/1999 |

OTHER PUBLICATIONS

D.S. Goodman, "Darkfield Illuminator Attachment," IBM Technical Disclosure Bulletin, vol. 27, No. 5, Oct. 1984.

J.L.C. Sanz et al, "Automated Visual Inspection with Dark-Field Microscopy," Journal of the Optical Society of America, Nov. 1985, USA, vol. 2, No. 11, pp. 1857-1862.

Carl Zeiss Brochure, "MSM 193 Microlithography Simulation Microscope," 1999.

* cited by examiner

CATADIOPTRIC IMAGING SYSTEM EXHIBITING ENHANCED DEEP ULTRAVIOLET SPECTRAL BANDWIDTH

This application is a continuation-in-part of U.S. patent application Ser. No. 10/434,374, entitled "High Performance Catadioptric Imaging System," inventors David G. Shafer, et al., filed May 7, 2003, which claims the benefit of U.S. Provisional Patent Application Ser. No. 60/449,326, entitled "High Performance, Low Cost Catadioptric Imaging System," filed Feb. 21, 2003.

BACKGROUND OF THE INVENTION

1. Field of the Invention

The present invention relates generally to the field of optical imaging and more particularly to catadioptric optical systems used for microscopic imaging, inspection, and lithography applications.

2. Description of the Related Art

Many optical systems have the ability to inspect or image features on the surface of a specimen, such as inspecting defects on a semiconductor wafer or photomask, or alternately examining a biological specimen on a slide. Microscopes have been used in various imaging situations, including biology, metrology, semiconductor inspection, and other complex inspection applications where high resolution images of small areas and/or features are desired.

Many such imaging systems are currently available, including those disclosed by applicants in various other issued patents and patent applications, including but not limited to U.S. patent application Ser. No. 10/434,374. The objective disclosed in the '374 application is a small catadioptric objective exhibiting beneficial optical qualities. The small size catadioptric optical design of the '374 application exhibits generally good overall performance, especially at high numerical apertures (NAs) over a very broad spectral range in the deep ultra-violet (DUV) region. Chromatic correction becomes increasingly difficult for performance in the DUV region.

In using an inspection design for the applications discussed, it can be beneficial to improve the overall spectral bandwidth of the system. Generally, the spectral bandwidth represents the variance in light wavelengths that may be employed using the design. For example, certain systems may successfully and efficiently employ light in the range of wavelengths from 800 nanometers down to 266 nanometers. These designs tend to have reduced bandwidths at shorter wavelengths, such as 212 nanometers. The previous designs thus include limited or narrow spectral bandwidths in the high end applications discussed.

Based on the optical characteristics desirable in such a design, a high spectral bandwidth can offer improved capabilities when inspecting specimens using light energy in the DUV range. For example, but not by way of limitation, operation within a range from 193 to 266 nm or greater may result in beneficial performance in certain circumstances. Previous designs do not demonstrate this capability.

It would therefore be beneficial to provide a system and objective for use in conjunction with standard microscopes and microscopy applications that overcome the foregoing drawbacks present in previously known imaging systems. Further, it would be beneficial to provide an optical inspection system design having improved functionality over devices exhibiting the negative aspects described herein.

SUMMARY OF THE INVENTION

According to one aspect of the present design, there is provided an objective and method employed for use in imaging a specimen. The objective may exhibit a relatively high spectral bandwidth and may comprise a lens group having at least one focusing lens, at least one field lens, and a Mangin mirror arrangement or catadioptric group positioned to receive the intermediate light energy and apply light energy to the specimen. The objective may provide, in certain instances, a spectral bandwidth up to approximately 193 to 266 nanometers and can provide numerical apertures in excess of 0.9.

These and other advantages of the present invention will become apparent to those skilled in the art from the following detailed description of the invention and the accompanying drawings.

DESCRIPTION OF THE DRAWINGS

The present invention is illustrated by way of example, and not by way of limitation, in the figures of the accompanying drawings in which.

DETAILED DESCRIPTION OF THE INVENTION

According to the present invention, there is provided a catadioptric objective having improved spectral bandwidth in advanced applications, such as microscopy and semiconductor wafer inspection. In general, the design may comprise lenses formed from a single glass or using a single glass with a field lens or lenses and possibly a front or first lens constructed from another glass, where the field lens or lenses may generally be disposed toward a mangin mirror/lens or catadioptric group and away from an intermediate image point.

Established Designs

Figure 1:
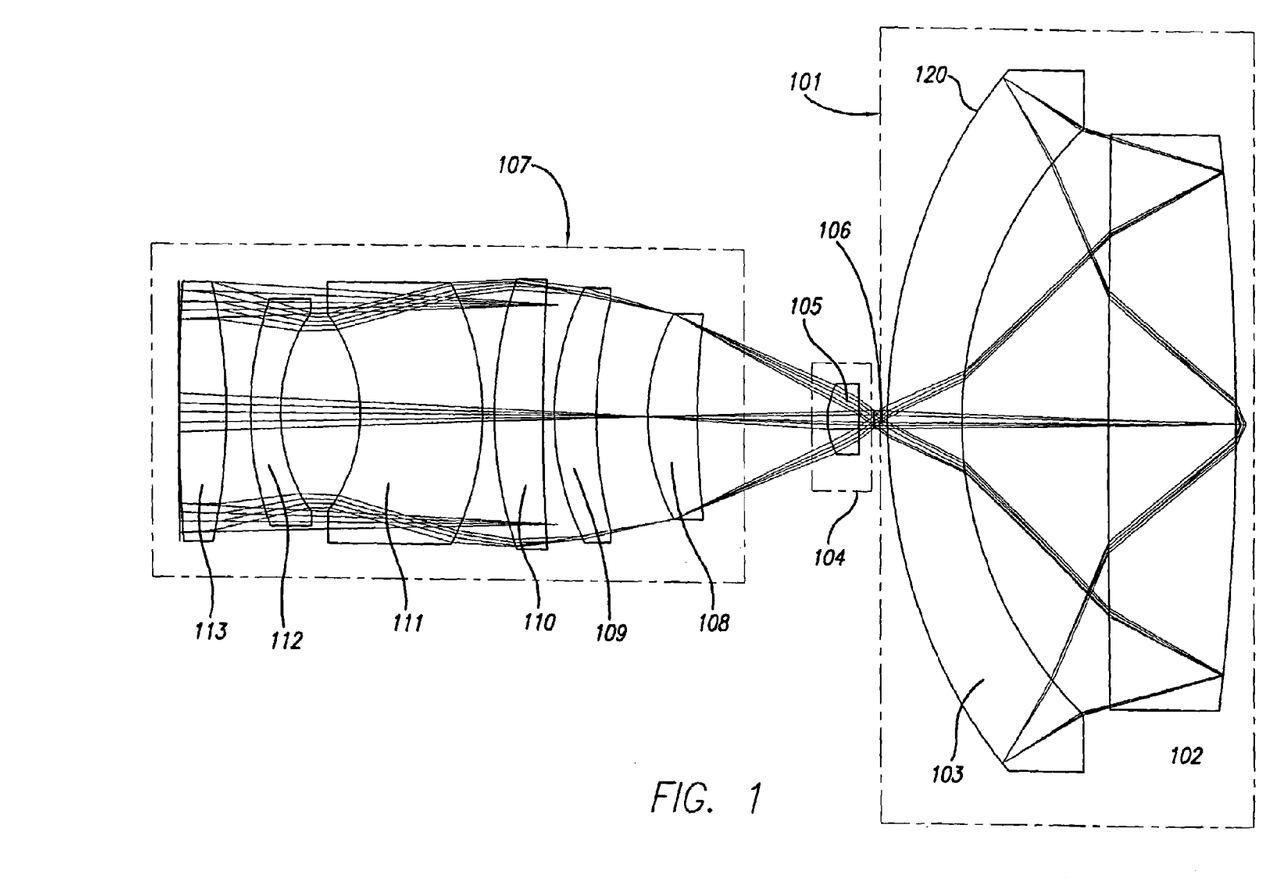
FIG. 1 presents a nine element reduced size catadioptric objective with a 0.9 NA in accordance with the previous designs having a relatively limited spectral bandwidth and a field size of approximately 0.150 mm.

One previous objective design is shown in FIG. 1. The catadioptric objective as shown in FIG. 1 is optimized for broad-band imaging in the UV spectral region, namely approximately 0.285 to 0.320 micron wavelengths. The objective provides relatively high numerical apertures and large object fields. The design of FIG. 1 uses the Schupmann principle in combination with an Offner field lens to correct for axial color and first order lateral color. As shown in the aspect presented in FIG. 1, the field lens group 105 is slightly displaced from the intermediate image 106 to obtain enhanced performance.

From FIG. 1 the catadioptric group 101 or Mangin mirror arrangement includes a Mangin mirror element 102. Mangin mirror element 102 is a reflectively coated lens element. The catadioptric group 101 also includes and a concave spherical reflector 103, also a reflectively coated lens element. Both elements in the catadioptric group 101 have central optical apertures where reflective material is absent. This allows light to pass from the object or specimen 100 (not shown) through Mangin mirror element 102, reflect from the second or inner surface of concave spherical reflector 103, onto the reflective surface 120 of Mangin mirror element 102, and through concave spherical reflector 103 to form an intermediate image 306 between concave spherical reflector 103 and field lens group 104. The field lens group 104 may comprise one or more lenses, and in the aspect shown in FIG. 1, one field lens is employed in the field lens group 104.

The focusing lens group 107 uses multiple lens elements, in the aspect shown six lens elements 108, 109, 110, 111, 112, and 113. All lenses in the focusing lens group 107 may be formed from a single type of material to collect the light from the field lens group 104 and the intermediate image 106.

The lens prescription for the design illustrated in FIG. 1 is presented in Table 1.

TABLE 1

Prescription for lenses for the design of FIG. 1

| Surface Number | Radius | Thickness | Glass | Diameter |
|---|---|---|---|---|
| OBJ | Infinity | Infinity | | 0 |
| 1 | Infinity | 15.50165 | | 9.39467 |
| STO | Infinity | −15.50165 | | 8 |
| 3 | 53.51878 | 2 | Fused Silica | 9.376161 |
| 4 | −18.17343 | 0.976177 | | 9.234857 |
| 5 | 10.48757 | 1.249953 | Fused Silica | 8.151456 |
| 6 | 5.891816 | 3.328088 | | 7.199539 |
| 7 | −5.254784 | 5.105439 | Fused Silica | 7.084075 |
| 8 | −8.860388 | 0.5 | | 9.430437 |
| 9 | 12.82516 | 2 | Fused Silica | 9.711337 |
| 10 | 61.04848 | 0.5 | | 9.468601 |
| 11 | 8.892555 | 1.75 | Fused Silica | 9.125279 |
| 12 | 15.75614 | 2.126452 | | 8.563035 |
| 13 | 7.216376 | 2 | Fused Silica | 7.4431 |
| 14 | 21.90145 | 5.382485 | | 6.702302 |
| 15 | 2.321495 | 1.3 | Fused Silica | 2.530266 |
| 16 | 13.47255 | 0.669203 | | 1.651874 |
| 17 | Infinity | 0.498865 | | 0.711891 |
| 18 | 17.99728 | 3.170995 | Fused Silica | 25 |
| 19 | 13.41607 | 6.08537 | | 21 |
| 20 | 972.9414 | 5.220004 | Fused Silica | 20.5 |
| 21 | −78 | −5.220004 | MIRROR | 20.5 |
| 22 | 972.9414 | −6.08537 | | 20.5 |
| 23 | 13.41607 | −3.170995 | Fused Silica | 21 |
| 24 | 17.99728 | 3.170995 | MIRROR | 25 |
| 25 | 13.41607 | 6.08537 | | 21 |
| 26 | 972.9414 | 5.220004 | Fused Silica | 20.5 |
| 27 | −78 | 0.3 | | 20.5 |
| IMA | Infinity | | | 0.410191 |

As may be appreciated by one skilled in the art, the numbers in the leftmost column of Table 1 represent the surface number counting surfaces from the left of FIG. 1. For example, the left surface of lens 108 in the orientation presented in FIG. 1 (surface 3 in Table 1) has a radius of curvature of 53.51878 mm, a thickness of 2 mm, and the rightmost surface (surface 4) has a radius of curvature of −18.17343 mm, and is 0.976177 mm from the next surface. The material used is fused silica, and the diameter of the left surface is 9.376161 mm and of the right surface is 9.234857 mm.

In the design presented in FIG. 1, the numerical aperture may approach or even exceed approximately 0.90. The design presented herein provides a maximum numerical aperture in all cases in excess of 0.65.

From FIG. 1, the focusing lens group 107 has the ability to receive light energy and transmit focused light energy. The field lens group 104 has the ability to receive the focused light energy and provide intermediate light energy, and form intermediate image 106. The catadioptric group or Mangin mirror arrangement 101 receives the intermediate energy and provides controlled light energy to the specimen. Alternately, the reflected path originates at the specimen, and light reflected from the specimen is received by the catadioptric group or Mangin mirror arrangement 101 and forms and transmits reflected light energy. The field lens group 104 receives the reflected light energy and transmitting resultant light energy, and the focusing lens group receives resultant light energy and transmits focused resultant light energy.

The design presented in FIG. 1 and Table 1 thus uses a single glass material, fused silica. Other materials may be employed, but it is noted that fused silica or any material used within the design may require low absorption over a wide range of wavelengths from 190 nm through the infrared wavelength. Use of fused silica can enable the design to be re-optimized for any center wavelength in this wavelength range. Re-optimization requires tuning or altering components.

The design presented in FIG. 1 and Table 1 can be optimized for use with lasers at 193, 198.5, 213, 244, 248, 257, 266, 308, 325, 351, 355, or 364 nm. The design can also be optimally employed to cover lamp spectral bands from 192-194, 210-216, 230-254, 285-320, and 365-546 nm. In addition, if calcium fluoride is employed as the glass or lens material, the design can be employed with an excimer laser at 157 nm or excimer lamps at 157 or 177 nm.

As noted in FIG. 1, the objective has a diameter of 26 millimeters, which is significantly smaller than objectives previously employed in this wavelength range. The objective can be mounted in a standard microscope turret with a 45 mm flange-to-object separation. The objective supports a numerical aperture of approximately 0.90, a field size of approximately 0.4 mm, and a polychromatic wavefront error of less than approximately 0.038 waves.

Most notably, the design of FIG. 1 has a corrected bandwidth in the range of approximately 285-313 nm, with a net spectral bandwidth range of approximately 28 nm. A higher spectral bandwidth would be beneficial to system performance in certain circumstances.

Increased Bandwidth Design

The design of FIG. 1 requires one glass type. In UV-DUV applications, fused silica is employed due to its high transmission properties. Fused silica also has adequate thermal stability and is relatively easy to polish.

Spectral bandwidth may be enhanced by using calcium fluoride in the UV-DUV design. Calcium fluoride has a higher transmission and lower dispersion than fused silica. In a combined calcium fluoride and fused silica design, both monochromatic and chromatic aberrations may be well controlled in order to obtain get good performance over as broad a spectral range as possible.

In order for the catadioptric objective to maintain good performance over the field, a balance may be sought between the axial chromatic aberration and the lateral chromatic aberration. Larger spectral bandwidths and shorter wavelengths tend to require more of a chromatic correction budget, namely more chromatic correction resources, allocated to correcting axial color. Allocating chromatic correction budget tends to limit the resultant field size. Alternatively, a fixed field size tends to limit the bandwidth and lowest wavelength that can be corrected for in a design.

When increasing spectral wavelength, particular attention may be directed to correction of axial and lateral color aberrations, at the paraxial level. Paraxial level aberrations are very low-order in the field and in the aperture, but can produce high-order variations in wavelength. Also, aberrations due to low-order chromatic variation in the monochromatic aberrations such as spherical, coma, astigmatism, field curvature, and distortion are of particular import. These aberrations are typically non-linear in aperture and field size.

Both of these aberration types may be controlled in the small catadioptric design using only silica for the glass. Axial and lateral color at the paraxial level may be corrected using the Schumpman principle and the Offner field lens.

The aberration theory can be understood by examining a very simplified version of the design consisting of (1) a single positive focusing lens, (2) a field lens at the intermediate image, and (3) a Mangin lens/mirror element, assuming the dispersion for the field lens glass is zero. If all three elements are assumed to have zero thickness and the field lens is located precisely at the intermediate image, enhanced aberration correction occurs when the field lens images the positive focusing lens onto the Mangin lens/mirror element at all wavelengths. Such aberration correction represents the lens aberration theory for the Offner field lens.

In reality, the elements have a finite thickness. Introducing thickness to the focusing lens and the Mangin lens/mirror element affects the aberration theory in a relatively minor manner. Thickness of the field lens can provide one of the most significant effects on overall performance. The dispersion and finite thickness of the field lens affects the way in which the field lens images the positive focusing lens and Mangin mirror elements. The interaction between dispersion/thickness of the field lens and imaging may be addressed by positioning the field lens away from the intermediate image, thereby tending to compensate for dispersion in the field lens. Alternately, the objective may comprise a glass exhibiting a relatively minimum amount of dispersion. The primary glass types used at wavelengths below 350 nm are calcium fluoride and fused silica. Of these, calcium fluoride exhibits lower dispersion values and tends to have improved chromatic correction as compared to fused silica. Both of these techniques, positioning the field lens at a position away from the intermediate image and using a glass or material comprising a relatively minimum amount of dispersion, may be employed.

Moving the field lens with respect to the intermediate image may positively or negatively affect chromatic correction. The field lens can be located away from the dome mangin element or closer to the dome mangin element. Based on observation, the orientation tending to minimize aberrations is positioning the field lens closer to the dome Mangin element. Positioning the field lens in this manner tends to provide different higher-order axial and lateral color wavelength variations when the field lens is on opposite sides of the intermediate image. Also, aberrations may be caused by the Mangin mirror. Light travels through the Mangin lens/mirror element three times. On the first pass the rays pass through the central part of the Mangin lens/mirror element, with a small diameter beam coming from the nearby intermediate image. On the second and third passes, light goes through the Mangin lens/mirror element with a relatively large full-aperture beam diameter. The radii of the Mangin lens/mirror element surfaces are typically computed based on aberration considerations for the second and third passes therethrough. The radii values for the first pass through the Mangin lens/mirror element are generally not optimized to minimize aberrations. These radii tend have an adverse effect on the chromatic variation in spherical aberration and coma. The Mangin lens/mirror element must also produce a significant amount of axial color at the intermediate image. This axial color may compensate for axial color introduced by the axial color of the focusing lens group.

Over a very broad spectral range the beam size on the Mangin lens/mirror element tends to vary to a degree with wavelength. This produces a variation in spherical aberration depending on wavelength. One way to address this issue is to make a central hole in the Mangin lens/mirror element so that the first light passing through the Mangin lens/mirror element is through air and does not encounter the inner and outer Mangin surfaces or radii associated therewith. Such a construction tends to create a relatively large central obscuration that may not be acceptable for many applications. Another way to address the issue is to locate a relatively small lens near the vertex of the outer radius of the Mangin lens/mirror element to partially compensate for the outer radius value of the Mangin lens/mirror element, thereby considerably reducing aberrations. A third way of addressing this issue is to position the field lens after the intermediate image, or away from the light source and closer to the specimen, and relatively close to the Mangin lens/mirror element. As noted, positioning the field lens away from the intermediate image tends to compensate for the dispersion of the field lens element. The radii of the field lens surfaces can be selected to partially compensate for the chromatic variation of aberration produced by the Mangin lens/mirror element on the first pass through. If the field lens is positioned on the other side of the intermediate image, away from the dome-shaped Mangin lens/mirror element, the field lens may be too far removed from the Mangin lens/mirror element to perform sufficient aberration compensation.

The field size of the small catadioptric objective may be limited by the aberrations at the edge of the field. The central part of the field may compensate for axial color, spherical aberration, and the chromatic variation of spherical aberration. Additional aberrations may be addressed at the edge of the field. Chromatic variation in spherical aberration, coma, and astigmatism tend not to limit performance at the edge of the field. As a result, chromatic variation in spherical aberration, coma, and astigmatism can be corrected by the radii, separation, and thickness of the front two lenses.

Lateral color tends to be the aberration limiting performance. Lateral color may be partially corrected by the field lens, and once corrected by the field lens, the residual lateral color may limit the achievable field size of the design.

Residual lateral color can be reduced by making one of the lenses in the focusing group near the collimated range from calcium fluoride instead of fused silica. The last lens, or the lens closest to the Mangin lens/mirror element, may be formed from calcium fluoride to correct the chromatic variation of aberrations. This change of material may introduce a small amount of residual axial color but has negligible effect on performance and may considerably reduce residual lateral color.

By changing the field lens and the last lens in the small catadioptric design to a lower dispersion glass, performance may be improved over an even broader spectral range. Alternately, the same spectral range may be used while achieving a larger field.

The design can be realized with a large spectral bandwidth and field size using seven elements. An additional lens can be added between the field lens and the Mangin lens/mirror element to aid with correcting the aberrations of the dome shaped Mangin lens/mirror element. The lens added may be a thin negative element. The radii and thickness of the field lens can be selected to relatively minimize lateral color without regard to the effects on the first pass through the Mangin lens/mirror element discussed earlier. Selection of specific radii and thicknesses of the field lens may further reduce the overall amount of residual lateral color for the system. In a design without the negative lens near the Mangin lens/mirror element, the field lens may compensate for the radii of the Mangin lens/mirror element and control lateral color. Addition of a further lens to the design may serve to decouple the lateral color issues from the radii of the Mangin lens/mirror element.

Embodiments Demonstrating Enhanced Spectral Bandwidth

Figure 2:
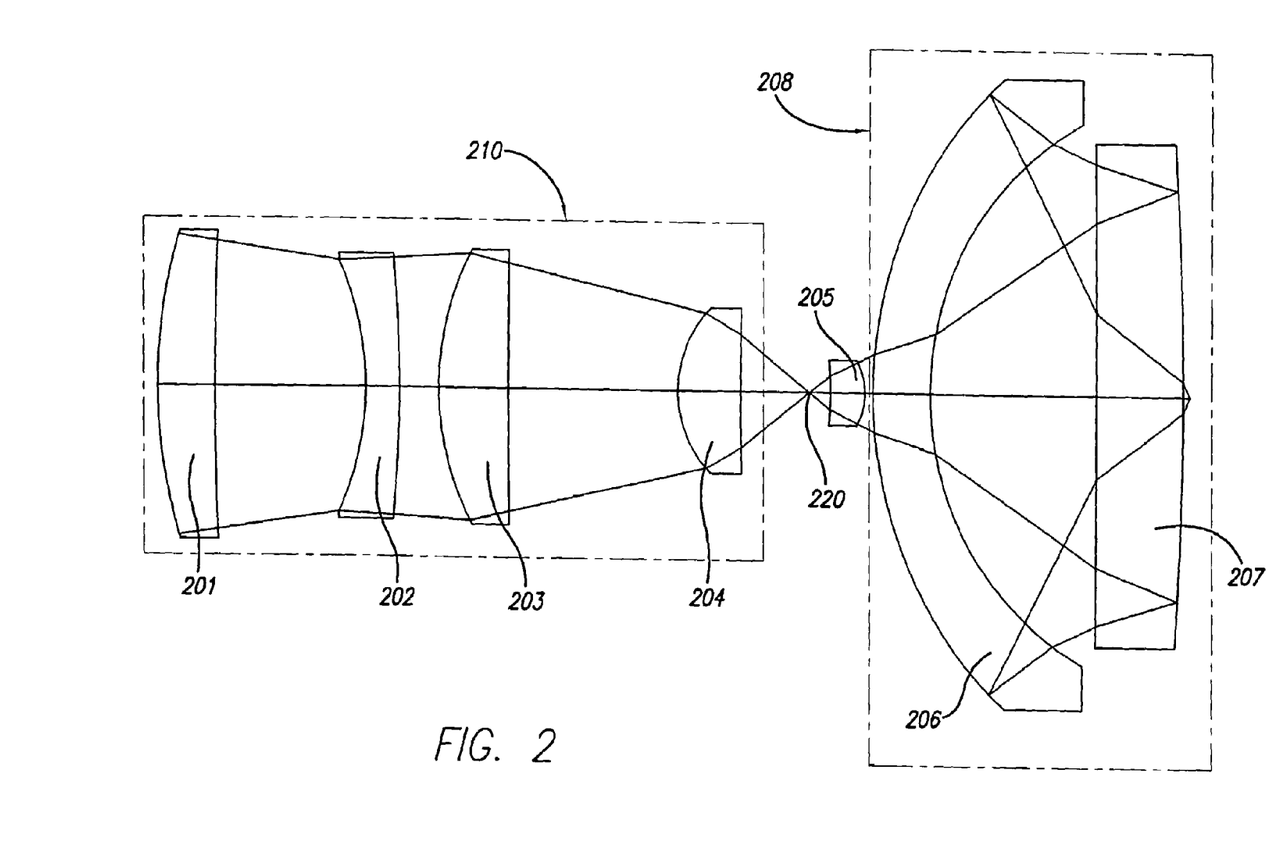
FIG. 2 illustrates an embodiment having a spectral bandwidth from approximately 212 to 267 nm constructed from a single glass material.

FIG. 2 illustrates one embodiment according to the present design. The design of FIG. 2 operates in an approximately 212-267 nm wavelength range and is constructed of lenses formed from fused silica. The field lens 205 is shifted toward the domed mangin lens/mirror element 206. The field size in the configuration of FIG. 2 is approximately 0.13 mm, providing a polychromatic Strehl ratio greater than approximately 0.90 at the edge of the field. The design 200 comprises first lens group 210 including first lens 201, second lens 202, third lens 203, and fourth lens 204. Intermediate image 220 is formed by first lens group 210. The design further includes field lens 205 between intermediate image 220 and domed mangin lens/mirror element 206, and inner lens 207 proximate the specimen (not shown in this view). Mangin lens/mirror element 206 and inner lens 207 form catadioptric group 208.

Table 2 presents the lens prescriptions for the embodiment illustrated in FIG. 2.

TABLE 2

Lens Prescriptions for the Design of FIG. 2

| Surf | Radius | Thickness | Glass |
|---|---|---|---|
| OBJ | Infinity | Infinity | |
| 1 | Infinity | 15.61151 | |
| STO | Infinity | −15.61151 | |
| 3 | 19.81334 | 2.5 | Fused silica |
| 4 | 225.9678 | 6.589166 | |
| 5 | −11.43651 | 1.5 | Fused silica |
| 6 | −54.13503 | 1.618672 | |
| 7 | Infinity | 0.1 | |
| 8 | 10.86654 | 3 | Fused silica |
| 9 | 529.9615 | 7.367915 | |
| 10 | 4.50866 | 2.75 | Fused silica |
| 11 | 93.08215 | 3.924248 | |
| 12 | −6.653505 | 1.5 | Fused silica |
| 13 | −3.494707 | 0.3 | |
| 14 | 16.33378 | 2.59334 | Fused silica |
| 15 | 12.0706 | 7.156338 | |
| 16 | Infinity | 3.779913 | Fused silica |
| 17 | −153.8636 | −3.779913 | MIRROR |
| 18 | Infinity | −7.156338 | |
| 19 | 12.0706 | −2.59334 | Fused silica |
| 20 | 16.33378 | 2.59334 | MIRROR |
| 21 | 12.0706 | 7.156338 | |
| 22 | Infinity | 3.779913 | Fused silica |
| 23 | −153.8636 | 0.3204443 | |
| IMA | Infinity | | |

Thus the relatively high spectral bandwidth objective of FIG. 2 includes a lens group, such as first lens group 201, comprising at least one focusing lens configured to receive light energy and form focused light energy. The focused light energy forms intermediate image 220. The objective further includes a field lens, or as shown below at least one field lens, oriented to receive the intermediate image 220 and provide intermediate light energy. The objective further includes a Mangin mirror arrangement or catadioptric group positioned to receive the intermediate light energy from the field lens 205 and form controlled light energy. The field lens 205 is formed from the same material as the other lenses in the objective, in this case fused silica.

Figure 3:
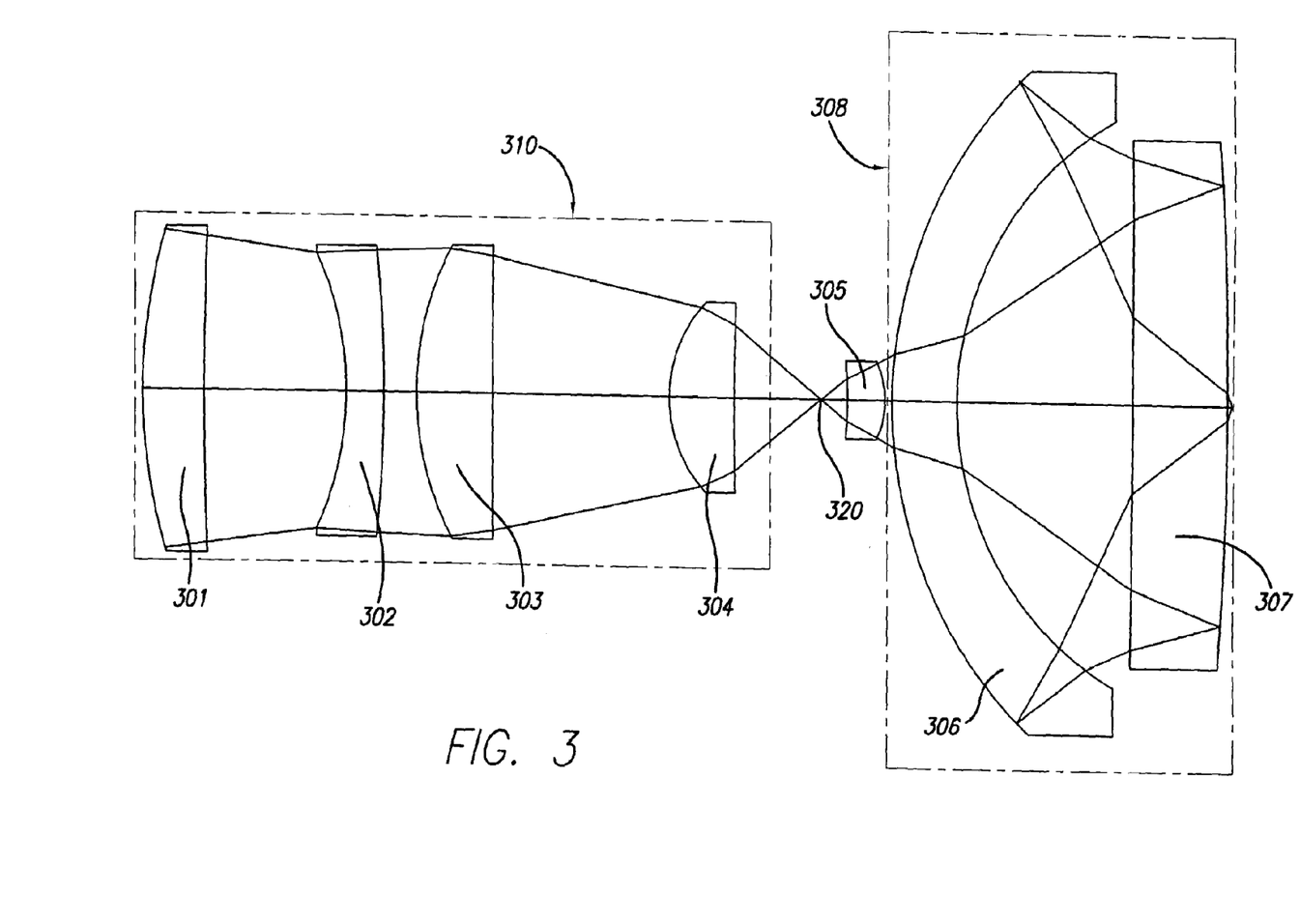
FIG. 3 is an embodiment having a spectral bandwidth from approximately 212 to 267 nm constructed from fused silica with a calcium fluoride field lens.

FIG. 3 illustrates an alternate embodiment having a slightly larger Strehl ratio. The design of FIG. 3 operates in an approximately 212-267 nm wavelength range and is constructed of lenses formed from fused silica with the field lens 305 formed of calcium fluoride. The field lens 305 is shifted toward the domed mangin lens/mirror element 306. The field size in the configuration of FIG. 3 is approximately 0.13 mm, providing a polychromatic Strehl ratio greater than approximately 0.94 at the edge of the field. The design 300 comprises first lens group 310 including first lens 301, second lens 302, third lens 303, and fourth lens 304. Intermediate image 320 is formed by first lens group 310. The design further includes field lens 305 between intermediate image 320 and domed mangin lens/mirror element 306, and inner lens 307 proximate the specimen (not shown in this view). Inner lens 307 and mangin lens/mirror element 306 form catadiptric group 308.

Table 3 presents the lens prescriptions for the embodiment illustrated in FIG. 3.

TABLE 3

Lens Prescriptions for the Design of FIG. 3

| Surf | Radius | Thickness | Glass |
|---|---|---|---|
| OBJ | Infinity | Infinity | |
| 1 | Infinity | 15.61151 | |
| STO | Infinity | −15.61151 | |
| 3 | 19.85568 | 2.5 | Fused silica |
| 4 | 143.1549 | 5.915116 | |
| 5 | −11.89678 | 1.5 | Fused silica |
| 6 | −42.51857 | 1.36081 | |
| 7 | Infinity | 0.1 | |
| 8 | 11.63274 | 3 | Fused silica |
| 9 | 113.5563 | 7.367915 | |
| 10 | 4.8017 | 2.75 | Fused silica |
| 11 | 154.1251 | 4.629613 | |
| 12 | −9.597954 | 1.5 | Calcium fluoride |
| 13 | −3.497525 | 0.3 | |
| 14 | 16.56579 | 2.7 | Fused silica |
| 15 | 12.13929 | 7.276186 | |
| 16 | Infinity | 3.779913 | Fused silica |
| 17 | −168.5788 | −3.779913 | MIRROR |
| 18 | Infinity | −7.276186 | |
| 19 | 12.13929 | −2.7 | Fused silica |
| 20 | 16.56579 | 2.7 | MIRROR |
| 21 | 12.13929 | 7.276186 | |
| 22 | Infinity | 3.779913 | Fused silica |
| 23 | −168.5788 | 0.3204443 | |
| IMA | Infinity | | |

Figure 4:
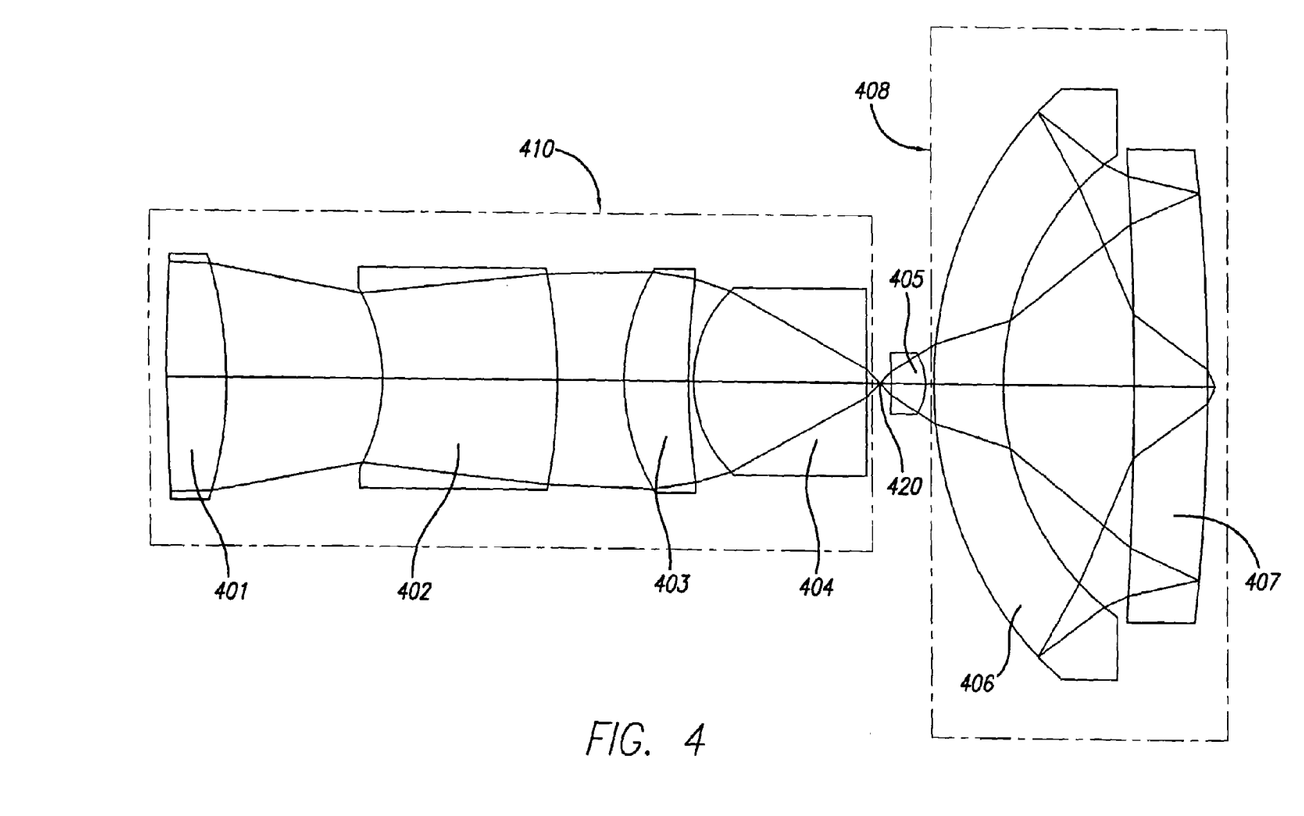
FIG. 4 shows an embodiment having a spectral bandwidth from approximately 193 to 266 nm constructed from fused silica with a calcium fluoride field lens and first or front lens.

FIG. 4 illustrates an alternate embodiment exhibiting a larger spectral bandwidth, namely in an approximately 193-266 nm wavelength range. The design of FIG. 4 is constructed of lenses formed from fused silica with the field lens 405 and first lens 401 formed of calcium fluoride. The field lens 405 is positioned between the intermediate image 420 and the domed mangin lens/mirror element 406. The field size in the configuration of FIG. 4 is approximately 0.13 mm, providing a polychromatic Strehl ratio greater than approximately 0.93 at the edge of the field with the relatively large spectral bandwidth noted. The design 400 comprises first lens group 410 including first lens 401, second lens 402, third lens 403, and fourth lens 404. Intermediate image 420 is formed by first lens group 410. The design further includes field lens 405 between intermediate image 420 and domed mangin lens/mirror element 406, and inner lens 407 proximate the specimen (not shown in this view). Mangin lens/mirror element 406 and inner lens 407 form catadioptric group 408.

Table 4 presents the lens prescriptions for the embodiment illustrated in FIG. 4.

TABLE 4

Lens Prescriptions for the Design of FIG. 4

| Surf | Radius | Thickness | Glass |
|---|---|---|---|
| OBJ | Infinity | Infinity | |
| 1 | Infinity | 22.00816 | |
| STO | Infinity | −22.00816 | |
| 3 | 91.40799 | 2.5 | Calcium Fluoride |
| 4 | −16.20989 | 6.643348 | |
| 5 | −6.707308 | 7.579655 | Fused Silica |
| 6 | −18.46371 | 2.749886 | |
| 7 | Infinity | 0.1 | |
| 8 | 7.661158 | 2.749523 | Fused Silica |
| 9 | 25.45565 | 0.25 | |
| 10 | 4.741755 | 7.374031 | Silica |
| 11 | −22.75465 | 1 | |
| 12 | −6.646462 | 1.5 | Calcium Fluoride |
| 13 | −2.117574 | 0.3 | |
| 14 | 14.68593 | 2.999932 | Fused Silica |
| 15 | 10.65269 | 5.619896 | |
| 16 | −173.6531 | 3.134266 | Fused Silica |
| 17 | −84.66868 | −3.134266 | MIRROR |
| 18 | −173.6531 | −5.619896 | |
| 19 | 10.65269 | −2.999932 | Fused Silica |
| 20 | 14.68593 | 2.999932 | MIRROR |
| 21 | 10.65269 | 5.619896 | |
| 22 | −173.6531 | 3.134266 | Fused Silica |
| 23 | −84.66868 | 0.32 | |
| IMA | Infinity | | |

Figure 5:
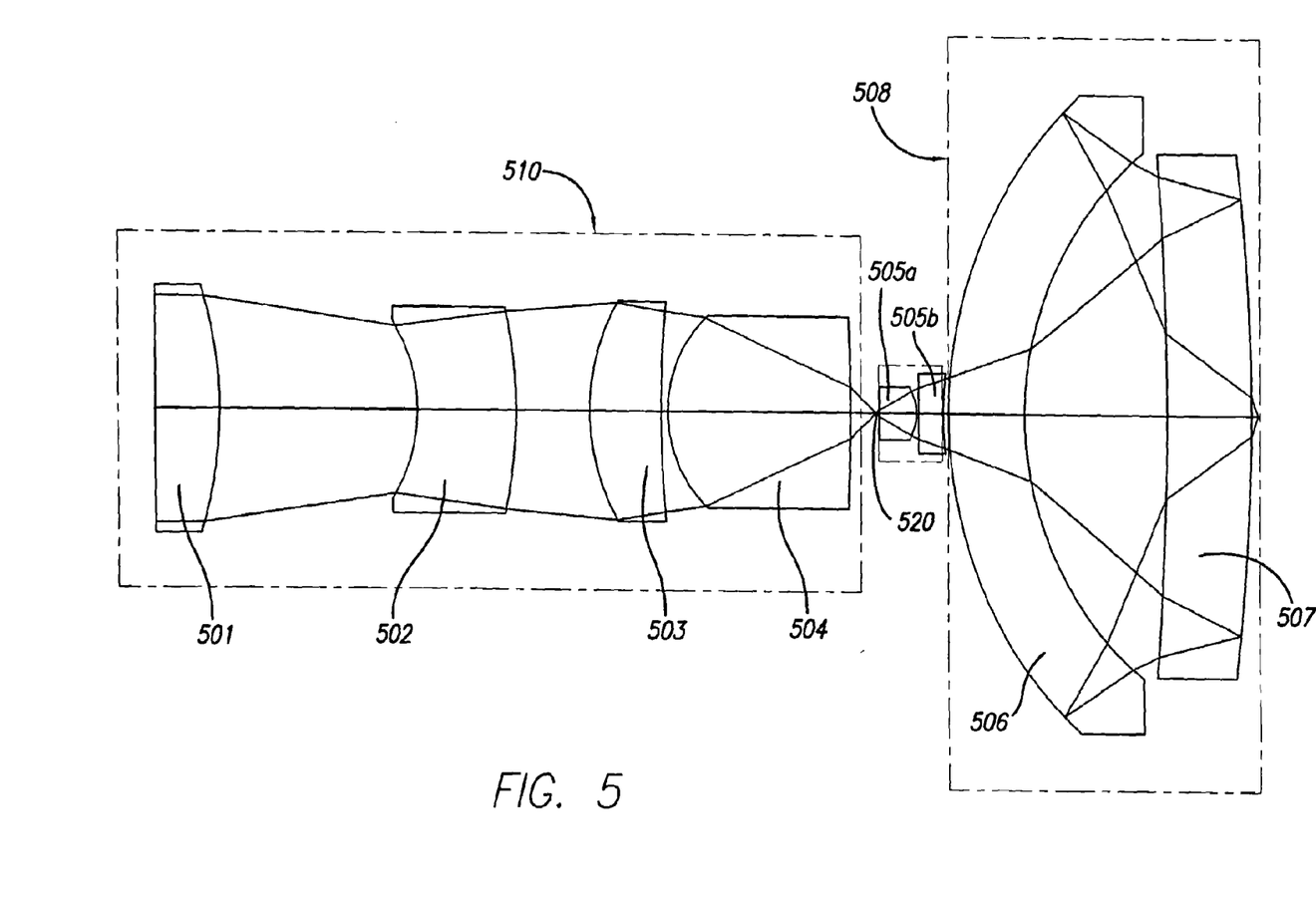
FIG. 5 illustrates an embodiment having a spectral bandwidth from approximately 193 to 266 nm constructed from fused silica with a calcium fluoride field lens and a calcium fluoride first or front lens.

FIG. 5 illustrates another embodiment exhibiting a larger spectral bandwidth, namely in the approximately 193-266 nm wavelength range. The design of FIG. 5 is constructed of lenses formed from fused silica with one field lens 505a and first lens 501 formed of calcium fluoride. The field lenses 505a and 505b are positioned between the intermediate image 520 and the domed mangin lens/mirror element 506. The field size in the configuration of FIG. 5 is approximately 0.13 mm, providing a polychromatic Strehl ratio greater than approximately 0.96 at the edge of the field with the relatively large spectral bandwidth noted. The design 500 comprises first lens group 510 including first lens 501, second lens 502, third lens 503, and fourth lens 504. Intermediate image 520 is formed by first lens group 510. The design further includes first field lens 505a and second field lens 505b between intermediate image 520 and domed mangin lens/mirror element 506, and inner lens 507 proximate the specimen (not shown in this view). Mangin lens/mirror element 506 and inner lens 507 form catadioptric group 508.

Table 5 presents the lens prescriptions for the embodiment illustrated in FIG. 5.

TABLE 5

Lens Prescriptions for the Design of FIG. 5

| Surf | Radius | Thickness | Glass |
|---|---|---|---|
| OBJ | Infinity | Infinity | |
| 1 | Infinity | 21.89616 | |
| STO | Infinity | −21.89616 | |
| 3 | Infinity | 2.5 | Calcium fluoride |
| 4 | −14.47669 | 7.668598 | |
| 5 | −5.520806 | 3.841903 | Fused silica |
| 6 | −16.52951 | 2.749819 | |
| 7 | Infinity | 0.1 | |
| 8 | 7.804903 | 2.75 | Fused silica |
| 9 | 35.75287 | 0.25 | |
| 10 | 4.607864 | 7.016985 | Fused silica |
| 11 | −10.51735 | 1.110633 | |
| 12 | −6.589348 | 1.5 | Calcium fluoride |
| 13 | −1.755602 | 0.1 | |
| 14 | −41.74985 | 1 | Fused silica |
| 15 | 14.9762 | 0.1 | |
| 16 | 14.9762 | 2.999805 | Fused silica |
| 17 | 11.71152 | 5.422253 | |
| 18 | −131.2793 | 3.241558 | Fused silica |
| 19 | −80.14333 | −3.241558 | MIRROR |
| 20 | −131.2793 | −5.422253 | |
| 21 | 11.71152 | −2.999805 | Fused silica |
| 22 | 14.9762 | 2.999805 | MIRROR |
| 23 | 11.71152 | 5.422253 | |
| 24 | −131.2793 | 3.241558 | Fused silica |
| 25 | −80.14333 | 0.32 | |
| IMA | Infinity | | |

The present system design may be employed in various environments, including but not limited to lithography, microscopy, biological inspection, medical research, and the like.

The design presented herein and the specific aspects illustrated are meant not to be limiting, but may include alternate components while still incorporating the teachings and benefits of the invention, namely the small design having increased spectral bandwidth capabilities, potentially using a field lens formed of a different material, the design having a high NA. While the invention has thus been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A relatively high spectral bandwidth objective employed for use in imaging a specimen, comprising:
    a lens group comprising at least one focusing lens configured to receive light energy and form focused light energy, said focused light energy forming an intermediate image;
    at least one field lens oriented to receive the intermediate image and provide intermediate light energy, each field lens having radii and thickness selected to relatively minimize lateral color without regard to effects of initial intermediate light energy transmission; and
    a Mangin mirror arrangement positioned between the at least one field lens and the specimen and configured to receive the intermediate light energy from the at least one field lens and form controlled light energy;
    wherein each field lens is completely displaced from the intermediate image and positioned between the intermediate image and the Mangin mirror arrangement.

2. The objective of claim 1, wherein the objective exhibits an uncorrected spectral bandwidth in the range of at least 212 to 266 nanometers.

3. The objective of claim 2, wherein the objective exhibits a spectral bandwidth in the range of at least 193 to 266 nanometers.

4. The objective of claim 1, wherein the objective exhibits a polychromatic Strehl ratio greater than approximately 0.9 at a field of the objective.

5. The objective of claim 1, wherein the mangin mirror arrangement comprises a catadioptric mirror/lens and an additional lens.

6. The objective of claim 1, wherein at least one field lens is formed of calcium fluoride and at least one other lens is formed of fused silica.

7. The objective of claim 6, wherein at least one other lens in addition to at least one field lens is formed of calcium fluoride.

8. The objective of claim 1, wherein at least one field lens is positioned closer to the mangin mirror arrangement than the intermediate image.

9. The objective of claim 1, where upon striking the specimen, at least a portion of light energy striking the specimen passes back through the mangin mirror arrangement, the at least one field lens, and at least a portion of the lens group.

10. A relatively high spectral bandwidth objective employed for use in imaging a specimen, comprising:
a plurality of lenses configured to receive light energy and convert said light energy into an intermediate image;
at least one field lens configured to receive said intermediate image and create field imaged light energy; and
a catadioptric group located between the at least one field lens and the specimen and configured to receive the field imaged light energy and apply catadioptric energy to the specimen;
wherein each field lens is completely displaced from the intermediate image and positioned between the intermediate image and the catadioptric group and further wherein the objective is configured to have a net spectral bandwidth range of at least 55 nanometers.

11. The objective of claim 10, wherein the objective exhibits a spectral bandwidth in the range of at least 193 to 266 nanometers.

12. The objective of claim 11, wherein the objective exhibits a spectral bandwidth in the range of at least 193 to 266 nanometers.

13. The objective of claim 10, wherein the objective exhibits a polychromatic Strehl ratio greater than approximately 0.9 at a field of the objective.

14. The objective of claim 10, wherein the catadioptric group comprises a catadioptric mirror/lens and an additional lens.

15. The objective of claim 10, wherein at least one field lens is formed of fused silica.

16. The objective of claim 15, wherein at least one other lens in addition to one field lens is formed of calcium fluoride.

17. The objective of claim 10, wherein at least one field lens is positioned between the intermediate image and the catadioptric group.

18. The objective of claim 10, where upon striking the specimen, at least a portion of light energy striking the specimen passes back through the catadioptric group, and at least one of the plurality of lenses.

19. A method of imaging a specimen, comprising:
receiving light energy;
converting said light energy into an intermediate image;
creating field imaged light energy from the intermediate image using at least one field lens; and
converting the field imaged light energy into catadioptric energy using a mangin mirror/lens arrangement located between the at least one field lens and the specimen and configured to apply the catadioptric energy to the specimen;
wherein each field lens is completely displaced from the intermediate image and positioned between the intermediate image and the man in mirror/lens arrangement and further wherein said receiving, converting light energy, creating, and converting field imaged light energy results in imaging the specimen with a net spectral bandwidth range of at least 55 nanometers.

20. The method of claim 19, wherein said receiving, converting light energy, creating, and converting field imaged light energy provides a spectral bandwidth in the range of at least 193 to 266 nanometers.

21. The method of claim 19, wherein said receiving, converting light energy, creating, and converting field imaged light energy provides a polychromatic Strehl ratio greater than approximately 0.9 at a field position.

22. The method of claim 19, wherein said receiving, converting light energy, creating, and converting field imaged light energy provides a spectral bandwidth in the range of at least 212 to 267 nanometers.

* * * * *